US009991377B2

(12) United States Patent
Mirchandani et al.

(10) Patent No.: US 9,991,377 B2
(45) Date of Patent: Jun. 5, 2018

(54) TRENCH FET WITH RUGGEDNESS ENHANCEMENT REGIONS

(71) Applicant: Infineon Technologies Americas Corp., El Segundo, CA (US)

(72) Inventors: Ashita Mirchandani, Torrance, CA (US); Timothy D. Henson, Torrance, CA (US); Ling Ma, Redondo Beach, CA (US); Niraj Ranjan, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days. days.

(21) Appl. No.: 13/793,926

(22) Filed: Mar. 11, 2013

(65) Prior Publication Data
US 2013/0264636 A1  Oct. 10, 2013

Related U.S. Application Data

(60) Provisional application No. 61/621,437, filed on Apr. 6, 2012.

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0626* (2013.01); *H01L 29/1095* (2013.01); *H01L 29/0696* (2013.01); *H01L 29/41766* (2013.01)

(58) Field of Classification Search
CPC .......... H01L 29/4236; H01L 29/66704; H01L 29/7813; H01L 29/1095; H01L 29/0626
(Continued)

(56) References Cited

U.S. PATENT DOCUMENTS 7,332,770 B2 * 2/2008 Kobayashi .......... H01L 29/0634
257/328
7,459,749 B2 * 12/2008 Yoshimochi .................. 257/332
(Continued)

OTHER PUBLICATIONS

Wolf, et al., "Silicon Processing for the VLSI Era: vol. 1—Process Technology", 2000, Lattice Press, 2nd Ed., ISBN 0-9616721-5-3, pp. 342-345.*

*Primary Examiner* — Tom Thomas
*Assistant Examiner* — Vincent Wall
(74) *Attorney, Agent, or Firm* — Murphy, Bilak & Homiller, PLLC (57) ABSTRACT

According to an exemplary implementation, a field-effect transistor (FET) includes first and second gate trenches extending to a drift region of a first conductivity type. The FET also includes a base region of a second conductivity type that is situated between the first and second gate trenches. A ruggedness enhancement region is situated between the first and second gate trenches, where the ruggedness enhancement region is configured to provide an enhanced avalanche current path from a drain region to the base region when the FET is in an avalanche condition. The enhanced avalanche current path is away from the first and second gate trenches. The ruggedness enhancement region can be of the second conductivity type that includes a higher dopant concentration than the base region. Furthermore, the ruggedness enhancement region can be extending below the first and second gate trenches.

6 Claims, 5 Drawing Sheets

(51) Int. Cl.
*H01L 29/10* (2006.01)
*H01L 29/417* (2006.01)

(58) Field of Classification Search
USPC .......................................... 257/330, 328, 356
See application file for complete search history.

(56) References Cited

U.S. PATENT DOCUMENTS

| | | | | |
|---|---|---|---|---|
| 8,049,270 B2 * | 11/2011 | Akiyama et al. | ............. | 257/328 |
| 2007/0114599 A1 * | 5/2007 | Hshieh | ................ | H01L 29/0634 |
| | | | | 257/330 |

* cited by examiner

Fig. 2A (Layout View)

Fig. 2B

Fig. 3 (Layout View)

TRENCH FET WITH RUGGEDNESS ENHANCEMENT REGIONS

The present application claims the benefit of and priority to a pending provisional application entitled "Ultra-Rugged Trench MOSFET," Ser. No. 61/621,437 filed on Apr. 6, 2012. The disclosure in this pending provisional application is hereby incorporated fully by reference into the present application.

BACKGROUND

In a field-effect transistor (FET), an avalanche condition can occur when a high voltage is applied across a drain to a source of the FET. In the avalanche condition, impact ionization of electron-hole pairs can generate avalanche current between a drain of the FET and a base of the FET. The ruggedness of a FET characterizes the FET's capability to withstand the avalanche current when subjected to unclamped inductive switching. Ruggedness is of particular concern in applications where the FET is susceptible to repetitive avalanche cycles. Examples include automotive systems in which the FET may be subjected to numerous instances of unclamped inductive switching over its lifetime. In these applications, significant parametric shift can occur over time if the FET is not sufficiently rugged. Planar FETs are typically employed in these applications over trench FETs, as trench FETs are unable to offer comparable ruggedness.

SUMMARY

A trench FET with ruggedness enhancement regions, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
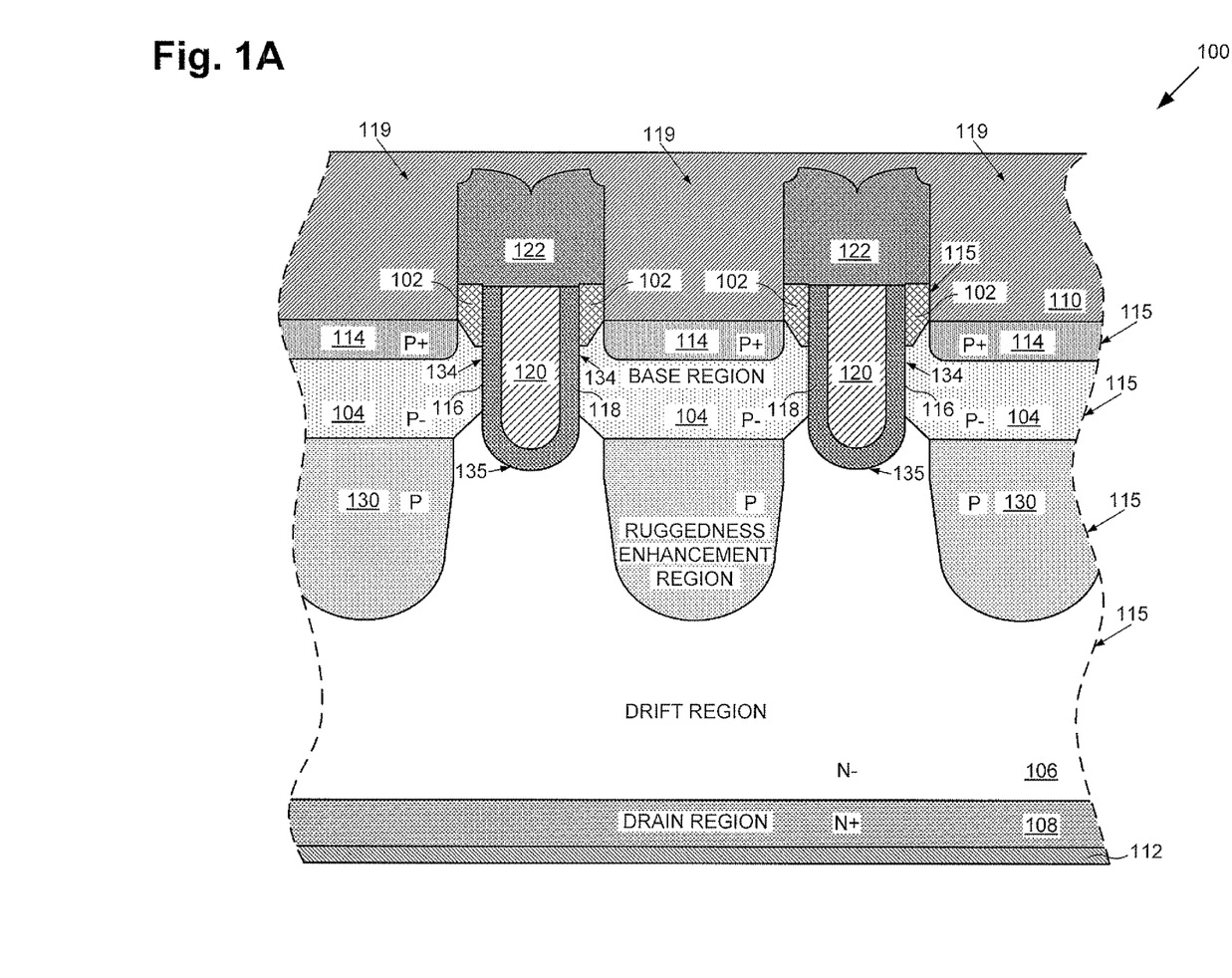
FIG. 1A presents an exemplary portion of a cross-section of a field-effect transistor.

FIG. 1A presents an exemplary portion of a cross-section of field-effect transistor (FET) 100. FET 100 includes source regions 102, base regions 104, drift region 106, drain region 108, contact regions 114, and ruggedness enhancement regions 130. Source regions 102, base regions 104, drift region 106, drain region 108, contact regions 114, and ruggedness enhancement regions 130 can each include semiconductor material. For example, source regions 102, base regions 104, drift region 106, drain region 108, contact regions 114, and ruggedness enhancement regions 130 can each be silicon.

Source regions 102, base regions 104, drift region 106, drain region 108, contact regions 114, and ruggedness enhancement regions 130 can be formed in various ways without deviating from the scope of the present disclosure. In the present implementation, as one example, drain region 108 is formed in a semiconductor substrate, such as a silicon substrate. Drain region 108 is of a first conductivity type and is shown as having N+ conductivity by way of example.

Source regions 102, base regions 104, drift region 106, contact regions 114, and ruggedness enhancement regions 130 can, for example, be formed in semiconductor body 115. In some implementations semiconductor body 115 includes float-zone silicon that is adhered to the substrate forming drain region 108. However, in the present implementation, semiconductor body 115 is epitaxially grown on drain region 108.

Drift region 106 includes epitaxial silicon grown on drain region 108. Drift region 106 is of the first conductivity type and is shown as having N− conductivity by way of example. Source regions 102, base regions 104, drift region 106, contact regions 114, and ruggedness enhancement regions 130 can be formed by etching and/or doping semiconductor body 115. However, as noted above, source regions 102, base regions 104, drift region 106, drain region 108, contact regions 114, and ruggedness enhancement regions 130 can be formed in various ways.

In FIG. 1A, gate trenches 116 are extending to drift region 106 of the first conductivity type. Gate trenches 116 each have opposing sidewalls 134, which are substantially parallel to one another (in the present example) and extend into respective trench bottoms 135. Gate trenches 116 each include gate dielectrics 118, which are lining gate trenches 116, and gate electrodes 120, which are situated respectively on gate dielectrics 118. As an example, forming gate trenches 116 can include etching into semiconductor body 115. Forming gate dielectrics 118 can include depositing and/or thermally growing dielectric material in gate trenches 116. Gate dielectrics 118 can be, for example, silicon dioxide. Next, forming gate electrodes 120 can include depositing conductive material in gate trenches 116. The conductive material can include, for example, metal and/or metal alloy or polysilicon. Etch-back and/or another planarization technique can be utilized on the conductive material to form gate electrodes 120.

In the implementation shown in FIG. 1A, source regions 102 are formed adjacent, and more particularly on, each of sidewalls 134 of gate trenches 116. Source regions 102 are of the first conductivity type and have N+ conductivity by way of example. Source regions 102 can be formed, for example, by doping semiconductor body 115 and optionally etching portions of semiconductor body 115. Source regions 102 are situated over base regions 104.

Base regions 104 are of a second conductivity type and are shown as having P− conductivity by way of example. Base regions 104 can be formed, for example, by doping semiconductor body 115. In FET 100, each of base regions 104 of the second conductivity type is situated between gate trenches 116. This is true for each of base regions 104 in FET 100, however; only two of gate trenches 116 are specifically shown in FIGS. 1A and 1B.

Contact regions 114 are also of the second conductivity type and are shown as having P+ conductivity by way of example. Contact regions 114 can be formed, for example, by doping semiconductor body 115 through contact openings 119. Contact regions 114 are situated over base regions 104 in FET 100.

Also in FET 100, source contact 110 is situated on and electrically connected to contact regions 114 and source regions 102. Drain contact 112 is situated on and electrically connected to drain region 112. Source contact 110 and drain contact 112 include conductive material, such as metal and/or metal alloy and can be utilized to form a current path between drain region 108 and source regions 102 during conduction of FET 100. Dielectric caps 122 include dielectric material and insulate gate electrodes 120 from source contact 110.

In the present embodiment, FET 100 is a trench FET and can have various configurations and features, which may be different than what is specifically shown. During regular operation, gate electrodes 120 can be utilized to selectively enable and disable FET 100 by modulating channels adjacent gate dielectrics 118 in base regions 104. However, during, for example, unclamped inductive switching, FET 100 may be connected to an inductor and experience a rapid change in current. When FET 100 is on, energy is stored in the inductor. When FET 100 is switched off, the inductor dissipates the stored energy into FET 100 by driving it into an avalanche condition, resulting in elevated junction temperature of FET 100. In the avalanche condition, impact ionization of electron-hole pairs can generate avalanche current between drain region 108 of FET 100 and base regions 104 of FET 100. The avalanche condition poses a threat of damaging FET 100, which may result in shift of device parameters such as threshold voltage (Vth), on-resistance Rds(on), and drain to source leakage (Idss).

Figure 1B:
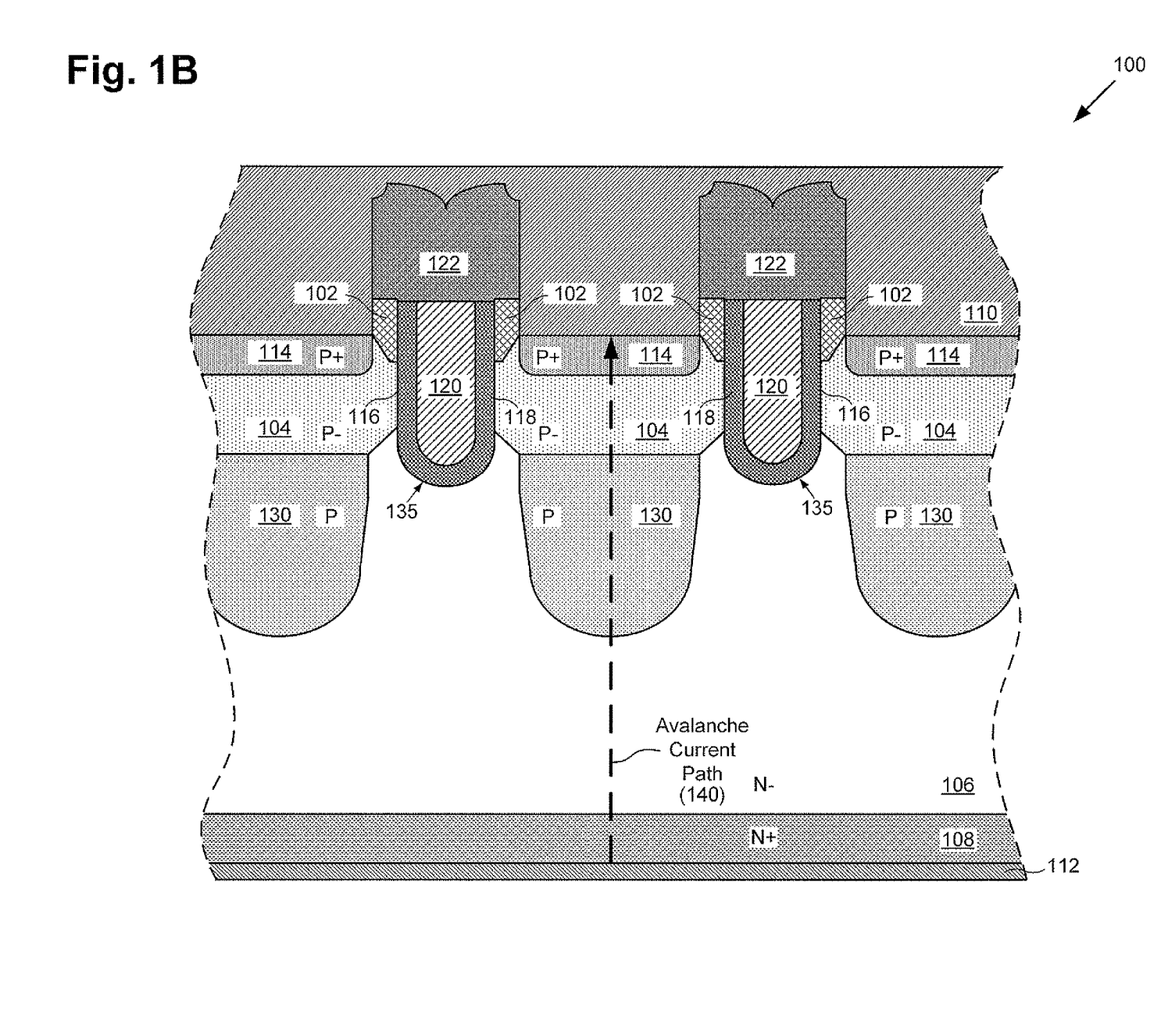
FIG. 1B presents an exemplary portion of a cross-section of a field-effect transistor.

FET 100 includes ruggedness enhancement regions 130, which are each situated between adjacent most ones of gate trenches 116. Referring to FIG. 1B, ruggedness enhancement regions 130 are configured to provide respective enhanced avalanche current paths, from drain region 112 to respective ones of base regions 104 when FET 100 is in an avalanche condition. The enhanced avalanche current paths significantly reduce the threat of damaging FET 100 and can avoid or minimize parametric shift due to repetitive avalanche conditions. Thus, FET 100 can have enhanced ruggedness.

In FET 100, without ruggedness enhancement regions 130, each avalanche current path from drain region 112 to respective ones of base regions 104 can traverse drift region 106 adjacent respective trench bottoms 135. High electric fields during an avalanche condition can concentrate near trench bottoms 135. At high temperatures, these high electric fields along with high avalanche current densities may result in carriers being injected into gate dielectrics 118. This can cause significant shift of device parameters such as, for example, threshold voltage (Vth), on-resistance Rds(on), and drain to source leakage (Idss) and can compromise the ruggedness of FET 100.

However, in FET 100, ruggedness enhancement regions 130 each cause the enhanced avalanche current path to be concentrated away from gate trenches 116. During an avalanche condition, highest electric fields and high avalanche current densities are substantially central to adjacent ones of gate trenches 116, thereby shielding gate dielectrics 118 and significantly reducing or eliminating the risk of carriers being injected into gate dielectrics 118.

Ruggedness enhancement regions 130 are of the second conductivity type and are shown as having P conductivity by way of example. In FIGS. 1A and 1B, conductivities are depicted to illustrate exemplary relative conductivity between different regions of FET 100. Thus, ruggedness enhancement regions 130 (having P conductivity) include a higher dopant concentration than base regions 104 (having P− conductivity). As shown in FIG. 1B, ruggedness enhancement regions 130 are situated partially within base regions 104, may extend below base regions 104, contact base regions 104, and are extending below gate trenches 116. Furthermore, ruggedness enhancement regions 130 include regions of highest dopant concentration at least partially above trench bottoms 135 of gate trenches 116. Particular locations of the regions of highest dopant concentration do not have to be at least partially above trench bottoms 135 and may be selected for based on various device parameters and/or desired device operating characteristics. As examples, the regions of highest dopant concentration could be completely above trench bottoms 135, completely below trench bottoms 135, or at least partially below trench bottoms 135. As one specific example, gate trenches 116 can be approximately 1.1 microns deep and ruggedness enhancement regions 130 can extend approximately 0.5 to approximately 1 micron below gate trenches 116. In doing so, ruggedness enhancement regions 130 can effectively contain high electric fields and high avalanche current densities away from gate trenches 116 during avalanche conduction.

Ruggedness is of particular concern in applications where FET 100 is susceptible to repetitive avalanche cycles. Examples of these applications include automotive systems in which avalanche performance is of high importance and degradation of device parameters during operation may be undesirable. In these applications, significant parametric shift can occur over time if FET 100 is not sufficiently rugged. Planar FETs are typically employed in these applications over trench FETs, as trench FETs are unable to offer comparable ruggedness. However, in accordance with various aspects of the present disclosure, FET 100 can be a trench FET while having sufficient ruggedness for automotive applications in which stability of device parameters over millions of avalanche cycles is required.

In various implementations, FET 100 is capable of sustaining from approximately one million to approximately one hundred million avalanche cycles with substantially no parametric shift. Furthermore, as the enhanced avalanche current paths are away from gate dielectrics 118 in gate trenches 116, gate dielectrics 118 can optionally be made thinner while still maintaining high ruggedness. More particularly, in an avalanche condition, carriers are less likely to be injected into gate dielectrics 118 and thus gate dielectrics 118 can be thinner. As an example, gate dielectrics 118 can have thicknesses ranging from approximately 200 angstroms to approximately 1200 angstroms.

Ruggedness enhancement regions 130 can be formed in various ways, which can include implanting dopants into semiconductor body 115 of FET 100. Optimal dosing and energy for the implant or implants depends upon the depth of gate trenches 116 as well as the thickness of gate dielectrics 118.

In some implementations, forming ruggedness enhancement regions 130 includes implanting dopants into semiconductor body 115 of FET 100 through contact openings 119. Forming contact regions 114 also includes implanting dopants into semiconductor body 115 of FET 100 through contact openings 119. Thus, ruggedness enhancement regions 130 may be substantially aligned with contact regions 114 in these implementations. Furthermore, ruggedness enhancement regions 130 are formed in each cell of FET 100 in the present example.

Figure 2A:
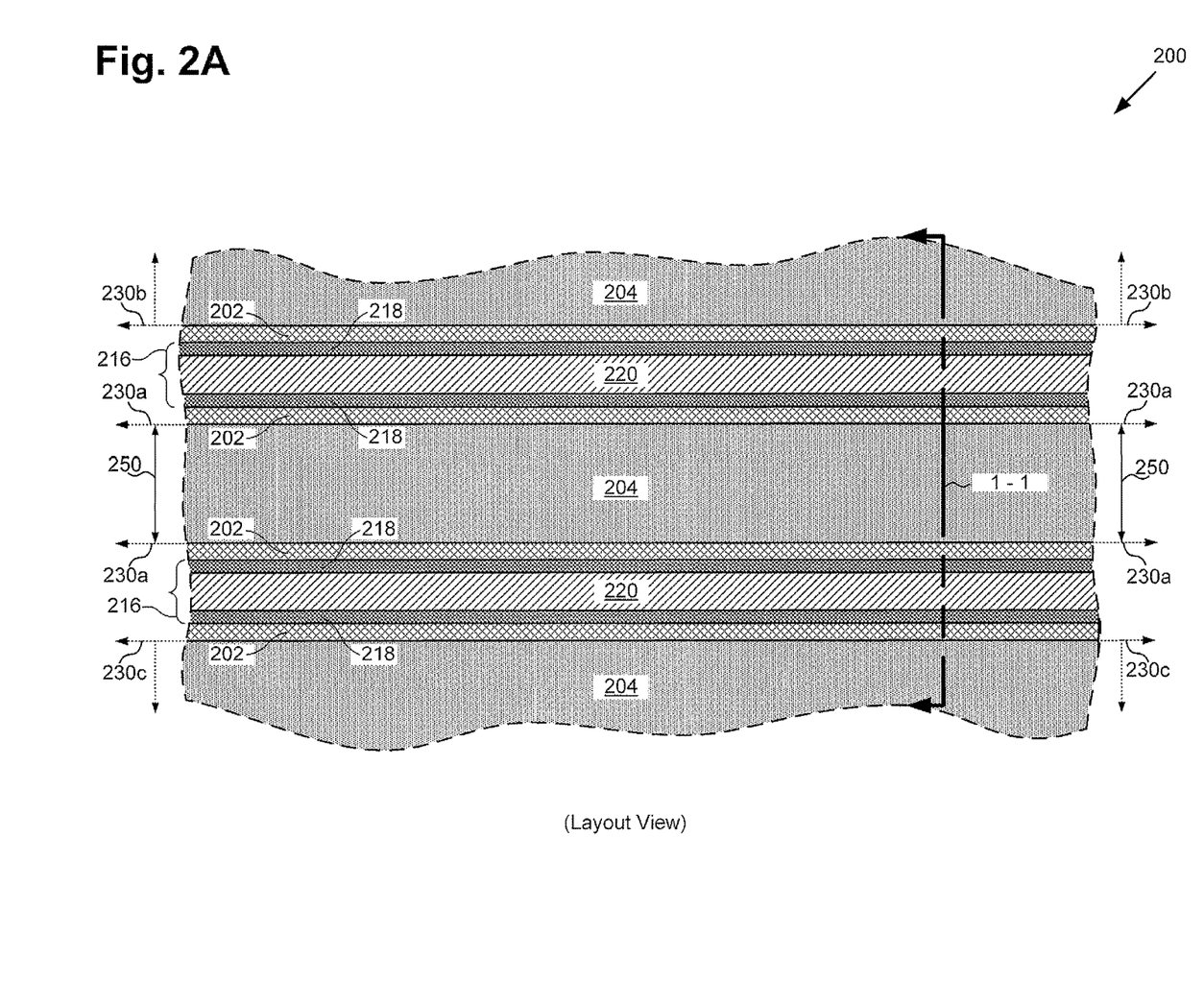
FIG. 2A presents an exemplary portion of a top layout view of a field-effect transistor.

FIG. 2A presents an exemplary portion of a top layout view of FET 200, corresponding to FET 100 in FIGS. 1A and 1B. FET 200 has cross-section 1-1 corresponding to the cross-section shown in FIGS. 1A and 1B. FET 200 has a striped layout, but may have a different layout in other implementations. Certain features of FET 200 are not shown in FIG. 2A for clarity of disclosure. As one example, gate electrodes 220 are each coupled to a gate bus that is not shown. FET 200 includes source regions 202, base regions 204, gate trenches 216, gate dielectrics 218, and gate electrodes 220, corresponding respectively to source regions 102, base regions 104, gate trenches 116, gate dielectrics 118, and gate electrodes 120 in FIGS. 1A and 1B.

FET 200 also includes ruggedness enhancement regions 230a, 230b, and 230c. Ruggedness enhancement regions 230a, 230b, and 230c correspond respectively to the central, leftmost, and rightmost of ruggedness enhancement regions 130 in FIGS. 1A and 1B. FET 200 can include other ruggedness enhancement regions not shown in FIG. 2A. For example, each cell of FET 200 can include a ruggedness enhancement region similar to ruggedness enhancement regions 230a.

In the implementation shown in FIG. 2A, ruggedness enhancement regions 230a, 230b, and 230c extend as respective stripes along with base regions 204. For example, ruggedness enhancement region 230a extends as a stripe, having width 250, along with base regions 204 (i.e. substantially parallel to base regions 204). Thus, in FET 200, each of ruggedness enhancement regions 230a, 230b, and 230c are situated between adjacent most gate trenches 216. For example, ruggedness enhancement region 230a is situated between adjacent ones of gate trenches 216 shown in FIG. 2A. Furthermore, only a single ruggedness enhancement region (e.g. ruggedness enhancement region 230a) is situated between adjacent most gate trenches 216 in the embodiment shown in FIG. 2A. Where forming ruggedness enhancement regions 230a, 230b, and 230c includes implanting dopants through, for example, contact openings 119 of FIGS. 1A and 1B, width 250 of ruggedness enhancement region 230a (and optionally widths of ruggedness enhancement regions 230b and 230c) can be substantially defined by a respective one of contact openings 119. However, in some implementations, ruggedness enhancement regions 230a, 230b, and 230c may increase Rds(on) of FET 200 by constricting on-state current flow path in the drift region.

Figure 2B:
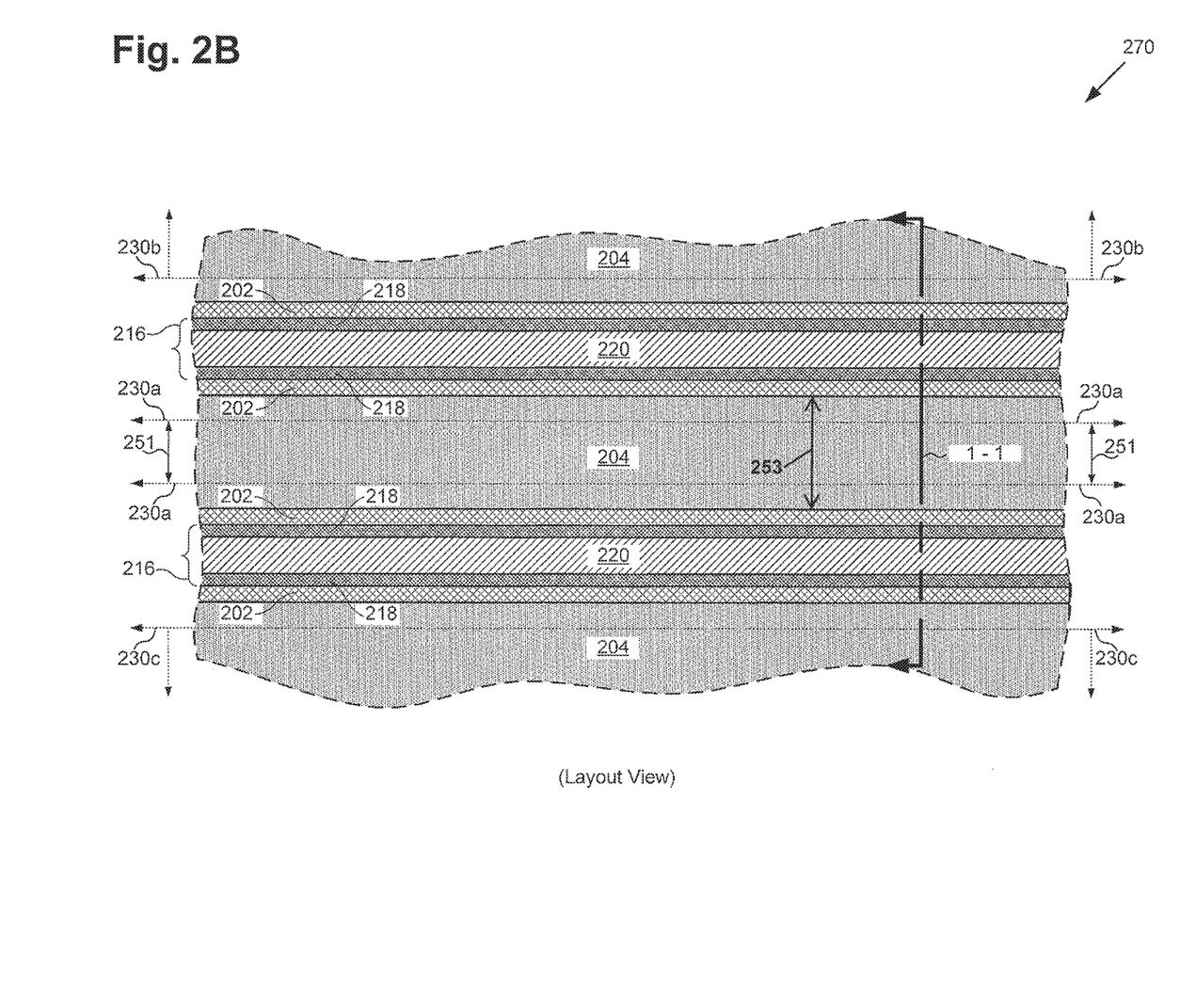
FIG. 2B presents an exemplary portion of a top layout view of a field-effect transistor.

FIG. 2B presents an exemplary portion of a top layout view of FET 270. In FET 270 width 251 of ruggedness enhancement region 230a (and optionally widths of ruggedness enhancement regions 230b and 230c) are smaller than width 250, thereby maintaining Rds(on). For example, in the implementation shown, width 251 of ruggedness enhancement region 230a is substantially less than the width 253 of its respective one of contact regions 114, shown in FIGS. 1A and 1B. Thus, each of contact regions 114, for example, can be wider than ruggedness enhancement region 230a between gate trenches 216.

Figure 3:
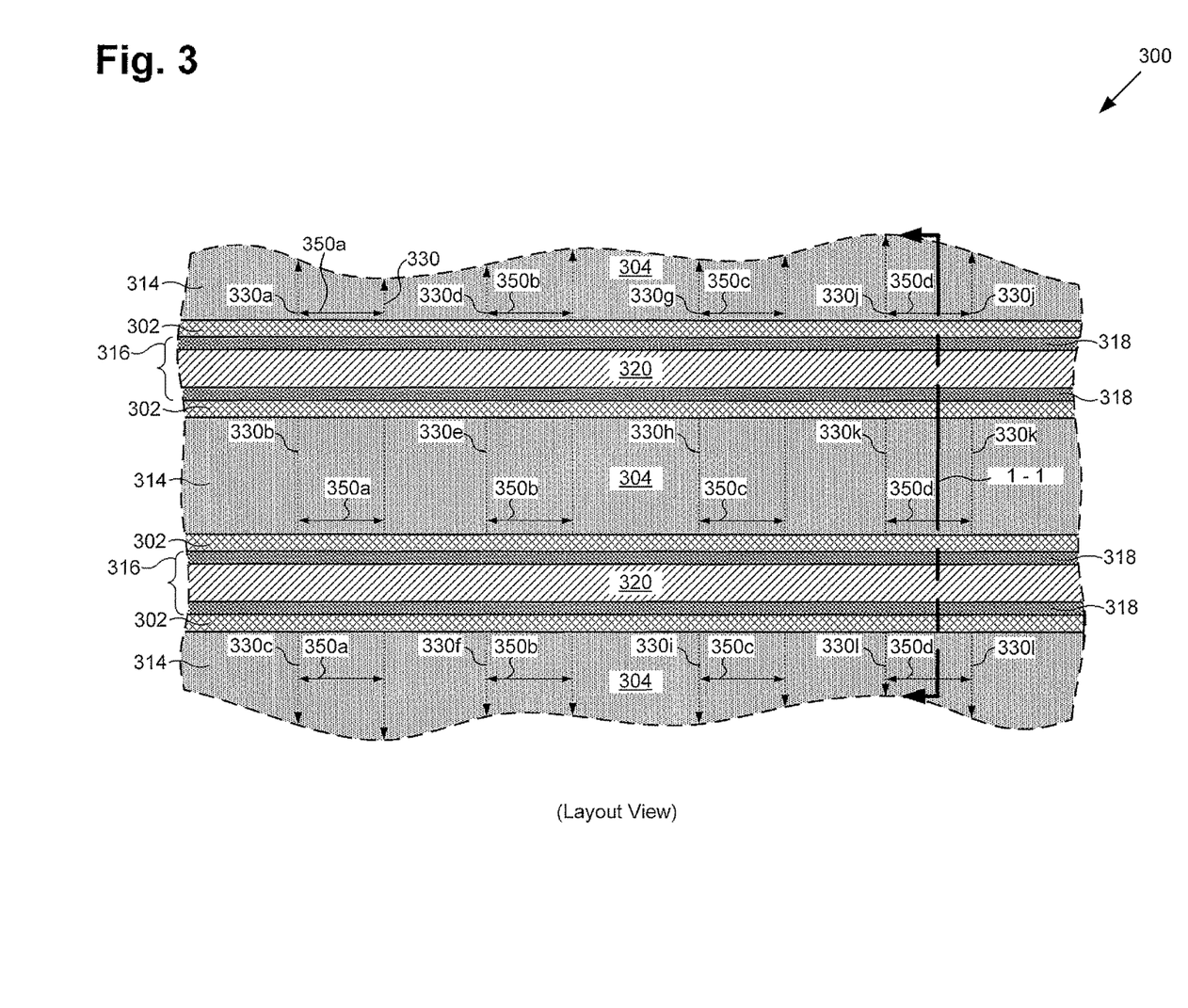
FIG. 3 presents an exemplary portion of a top layout view of a field-effect transistor.

Width 251 can be made narrower than the width 253 of its respective one of contact regions 114 utilizing various approaches. In one implementation, for example, a mask is utilized to define width 251. The mask may be formed in contact openings 119 and can include respective striped openings for implanting dopants to form ruggedness enhancement regions 230a, 230b, and 230c. As another example, spacers (e.g. silicon nitride spacers) can be formed on sidewalls of contact openings 119 and dopants can be implanted to form ruggedness enhancement regions 230a, 230b, and 230c. Thus, it will be appreciated that in various implementations, widths of ruggedness enhancement regions 230a, 230b, and 230c can be substantially greater than, equal to, or less than widths of respective contact regions 114. FIG. 3 illustrates another approach that may be utilized to maintain Rds(on).

FIG. 3 presents an exemplary portion of a top layout view of FET 300, corresponding to FET 100 in FIGS. 1A and 1B. FET 300 has cross-section 1-1 corresponding to the cross-section shown in FIGS. 1A and 1B. FET 300 has a striped layout, but may have a different layout in other implementations. Certain features of FET 300 are not shown in FIG. 3 for clarity of disclosure. As one example, gate electrodes 320 are each coupled to a gate bus that is not shown. FET 300 includes source regions 302, base regions 304, gate trenches 316, gate dielectrics 318, and gate electrodes 320, corresponding respectively to source regions 102, base regions 104, gate trenches 116, gate dielectrics 118, and gate electrodes 120 in FIGS. 1A and 1B.

FET 300 also includes ruggedness enhancement regions 330a, 330b, 330c, 330d, 330e, 330f, 330g, 330h, 330i, 330j, 330k, and 330l (also referred to as "ruggedness enhancement regions 330"). Ruggedness enhancement regions 330j, 330k, and 330l correspond respectively to the leftmost, central, and rightmost of ruggedness enhancement regions 130 in FIGS. 1A and 1B. In the present embodiment, remaining ones of ruggedness enhancement regions 330 can correspond to other ruggedness enhancement regions 130 of FET 100.

As shown in FIG. 3, base regions 304 extend as respective stripes and multiple ruggedness enhancement regions 330 are dispersed along the respective stripes. In FIGS. 2A and 2B, only a single ruggedness enhancement region (e.g. ruggedness enhancement region 230a) is situated between adjacent most gate trenches 216. In contrast, FIG. 3 shows multiple ruggedness enhancement regions (e.g. ruggedness enhancement regions 330b, 330e, 330h, and 330k) are situated between adjacent most gate trenches 316. In doing so, ruggedness enhancement regions 330 occupy less active area in FET 300 than in FET 200. By selecting for this active area, ruggedness requirements of FET 300 can, for example, be balanced with Rds(on) requirements.

As shown in FIG. 3, base regions 304 extend as respective stripes, where groups of ruggedness enhancement regions 330 are aligned substantially perpendicular to the respective stripes. For example, a group including ruggedness enhancement regions 330j, 330k, and 330l are aligned with one another substantially perpendicular to the respective stripes of base regions 314.

Ruggedness enhancement regions 330 can be formed, for example, by masking contact openings 119 and utilizing striped openings in the mask. However, it will be appreciated that ruggedness enhancement regions 330 can be formed in other manners. Where a mask is employed, each of the striped openings may be utilized for implanting dopants to form respective groups of ruggedness enhancement regions 330. For example, one striped opening can be utilized to form one group of ruggedness enhancement regions 330 including ruggedness enhancement regions 330a, 330b, and 330c. As such, ruggedness enhancement regions 330a, 330b, and 330c are each of width 350a. Another striped opening for can be utilized to form a group of ruggedness enhancement regions 330 including ruggedness enhancement regions 330d, 330e, and 330f. As such, ruggedness enhancement regions 330d, 330e, and 330f are each of width 350b. Yet another striped opening for can be utilized to form a group of ruggedness enhancement regions 330 including ruggedness enhancement regions 330g, 330h, and 330i. As such, ruggedness enhancement regions 330g, 330h, and 330i are each of width 350c. Still another striped opening for can be utilized to form a group of ruggedness enhancement regions 330 including ruggedness enhancement regions 330j, 330k, and 330l. As such, ruggedness enhancement regions 330j, 330k, and 330l are each of width 350d.

The striped openings can have different widths with respect to one another and those widths can determine widths 350a, 350b, 350c, and 350d of ruggedness enhancement regions 330. The active area consumed by ruggedness enhancement regions 330 can be selected for by selecting the widths of the striped openings so as to select for widths 350a, 350b, 350c, and 350d of ruggedness enhancement regions 330, shown in FIG. 3. Furthermore, the active area consumed by ruggedness enhancement regions 330 can also be selected for by selecting the number of striped openings of the mask and thereby the number of ruggedness enhancement regions 330 formed in FET 300.

Thus, as described above with respect to FIGS. 1A, 1B, 2A, 2B, and 3, in accordance with various implementations described herein, a FET includes at least one ruggedness enhancement region. The at least one ruggedness enhancement region is configured to provide an enhanced avalanche current path from a drain region to a base region of the FET when the FET is in an avalanche condition. The FET can thereby have high ruggedness and can sustain repetitive avalanche cycles. For example, the FET can be a trench FET having sufficient ruggedness at elevated temperatures and high avalanche current densities, making it suitable for automotive applications or other applications that require parametric stability over the lifetime of the FET.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A field-effect transistor (FET) comprising:
first and second gate trenches having respective trench bottoms extending to a drift region of a first conductivity type;
a base region of a second conductivity type that is situated between said first and second gate trenches;
a plurality of ruggedness enhancement regions situated between said first and second gate trenches;
a contact region, of said second conductivity type, that is situated over said base region and under a contact opening, wherein a maximum width of each of said plurality of ruggedness enhancement regions is substantially less than a maximum width of said contact region;
wherein said base region extends as a stripe, and said plurality of ruggedness enhancement regions are dispersed below said stripe;
wherein said ruggedness enhancement regions have a highest dopant concentration at least partially above said respective trench bottoms;
wherein said ruggedness enhancement regions are of said second conductivity type having a higher dopant concentration than said base region, and wherein said contact region is of said second conductivity type having a higher dopant concentration than said ruggedness enhancement regions.

2. The FET of claim 1, wherein said ruggedness enhancement regions extend below said first and second gate trenches.

3. The FET of claim 1, wherein said ruggedness enhancement regions extend as respective stripes along said base region.

4. The FET of claim 1, wherein groups of said ruggedness enhancement regions are aligned substantially perpendicular to said stripe.

5. The FET of claim 1, wherein said plurality of ruggedness enhancement regions directly adjoin said base region and extend from said base region into said drift region.

6. The FET of claim 1, further comprising spacers formed on sidewalls of said contact opening.

* * * * *